United States Patent [19]

Kondo et al.

[11] Patent Number: 5,710,512

[45] Date of Patent: Jan. 20, 1998

[54] STRUCTURE AND PRODUCTION PROCESS FOR SECONDARY VOLTAGE DETECTOR FOR ENGINE

[75] Inventors: Noriaki Kondo; Masaru Kondou, both of Nagoya, Japan

[73] Assignee: NGK Spark Plug Co., Ltd., Nagoya, Japan

[21] Appl. No.: 550,154

[22] Filed: Oct. 30, 1995

[30] Foreign Application Priority Data

Nov. 1, 1994 [JP] Japan .................... 6-268749

[51] Int. Cl.$^6$ .................................................. F02P 17/00
[52] U.S. Cl. .................. 324/402; 324/390; 29/749; 29/755
[58] Field of Search ................ 29/749, 755; 73/116, 73/117.2; 324/402, 391, 393, 379, 390

[56] References Cited

U.S. PATENT DOCUMENTS

| 5,307,017 | 4/1994 | Maruyama | 324/402 |
| 5,317,268 | 5/1994 | Maruyama | 324/402 |
| 5,438,269 | 8/1995 | Maruyama | 324/402 |
| 5,453,694 | 9/1995 | Miyata | 73/116 |
| 5,461,316 | 10/1995 | Maruyama | 73/116 |

FOREIGN PATENT DOCUMENTS

| 4-314969 | 11/1992 | Japan . |
| 4-347373 | 12/1992 | Japan . |

*Primary Examiner*—Ernest F. Karlsen
*Assistant Examiner*—Jose M. Solis
*Attorney, Agent, or Firm*—Foley & Lardner

[57] ABSTRACT

A detector for detecting a secondary voltage supplied to a spark plug of an engine comprises a rubber tube mounted on a high tension cord and equipped with a detecting electrode, and a shield case or shield layer enclosing the rubber tube. The rubber tube is made up of first and second semicylindrical rubber members joined together into a tubular shape. The detecting electrode is U-shaped and has a middle portion embedded in the first rubber member and left and right ends which project, respectively, from left and right joint surfaces of the first rubber member, and are sheathed in grooves in left and right joint surfaces of the second rubber member. A lead wire is connected to one of the left and right projecting ends of the detecting electrode. This structure of the secondary voltage detector can facilitate the production process.

28 Claims, 7 Drawing Sheets

STRUCTURE AND PRODUCTION PROCESS FOR SECONDARY VOLTAGE DETECTOR FOR ENGINE

BACKGROUND OF THE INVENTION

The present invention relates to structure and production process for a secondary voltage detector which is mounted on a high tension cord supplying a secondary voltage to a spark plug of an gasoline engine and which is designed to detect a secondary voltage waveform by monitoring a voltage of a detecting electrode induced by electrostatic induction between the high tension cord and the detecting electrode.

To meet requirements for emission control and fuel economy in automotive engines, there has been proposed a system which, by detecting the waveform of a secondary voltage applied to a spark plug of each cylinder of an internal combustion engine, monitors an igniting condition of each cylinder, and takes a corrective control action to hold all the cylinders exempt from misfire.

Japanese Patent Provisional Publications No. 4-314969 (Application No. 3-80107) and No. 4-347373 (Application No. 3-118631) show secondary voltage detectors of a capacitance type utilizing a capacitance formed with a secondary circuit. In this type, an electrode in the form of a metal tube is fit in a collar of rubber or resin, which in turn is mounted on a high tension cord or a plug cap of DLI (distributor-less ignition).

This conventional design of the secondary voltage detector tends to complicate the production process, however.

First, this design requires two different molding operations to form rubber or resin layers on both of outer and inner sides of the electrodes. For example, a molding step is performed with one end of the electrode fixed to a mold, and another molding step is further required to bury the end of the electrode.

Furthermore, the high tension cord must be inserted into the tubular electrode before connecting terminals (caps) are fixedly mounted on both ends of the high tension cord whether the molding operation is done before or after insertion of the high tension cord into the tubular electrode. Therefore, the process for producing the high tension cord is complicated by the intervention of the process for producing the secondary voltage detector.

SUMMARY OF THE INVENTION

It is therefore an object of the present invention to provide a secondary voltage detector and a secondary voltage detector producing process which can reduce the number of producing operations, and make the sequence of operations flexible.

According to the present invention, a secondary voltage detector, mounted on a high tension cord, for detecting a secondary voltage supplied through the high tension cord to a spark plug of a gasoline engine, by forming a capacitance with the high tension cord comprises:

- an insulating tube which is mounted on the high tension cord, and which comprises a plurality of insulating members joined together;
- a detecting electrode embedded in at least one of the insulating members; and
- an electric shielding means or shielding member enclosing the insulating tube.

The secondary voltage detector according to the present invention can accurately detect the secondary voltage waveform by monitoring a voltage of the detecting electrode induced by electrostatic induction between the high tension cord and the detecting electrode.

The insulating tube comprising the insulating members can be readily mounted on the high tension cord. Therefore, the process for producing the secondary voltage detector can be separate and independent from the process for producing the high tension cord. The present invention can thus eliminate undesired constraints on the design and control of the overall production process.

The secondary voltage detector of the present invention can be mounted anywhere between both ends of the high tension cord. The high tension cord is usually equipped with terminals called plug cap and coil cap. In general, it is advantageous in ease in secondary voltage detection and mounting operation to mount the secondary voltage detector between the plug cap and coil cap. However, it is possible to mount the secondary voltage detector of the present invention at the plug cap or the coil cap of the high tension cord.

The insulating members may be made of a rubber, a plastic or any of the various other insulating materials.

An elastic material, such as rubber is advantageous as the material of the insulating members. The elastic material is superior in adherence to the high tension cord, and not likely to injure the high tension cord.

The insulating members can be joined together into the insulating tube by a rubber cement, an epoxy resin, or any of the various other adhesives.

The size, shape and material of the detecting electrode and the distance of the detecting electrode from the high tension cord can be chosen appropriately as long as a predetermined capacitance (equal to or higher than 1 PF, for example) is obtained.

The shielding means or member provides a shielding enclosure for facilitating the secondary voltage waveform detection. The shielding means or member may be in the form of a shielding case or a coated layer. Metallic sheet or plate, metallic foil, coating or mesh can be used as the shielding means. When a grounding conductor is connected to the shielding member, it is preferable to make the length of the grounding conductor equal to or smaller than 30 cm in order to improve the shielding performance.

The rubber having the insulating property is advantageous as the material of the insulating members because of its elasticity, durability and workability.

The rubber cement is preferable when the rubber is used as a material of the insulating members because of the adhesive strength, and the similarity in nature to the rubber. The insulating members bonded by the rubber cement are resistant to separation even when the insulating tube made up of the insulating members is bent, and superior in water proofing.

The detecting electrode may comprise an embedded middle portion embedded in one of the insulating members, and at least one bare electrode end projecting from a joint surface of the insulating member. The projecting bare end of the detecting electrode facilitates the process of forming the insulating member in which the detecting electrode is embedded. In the present invention, it is possible to form an insulating member and to embed the detecting electrode therein by only one molding operation in which the projecting end of the detecting electrode is fixed to the mold (or die) and the insulating material is filled around the middle portion of the detecting electrode. Therefore, the production process is simplified. Furthermore, the production process requires only one type of the metal mold or die, and simplifies the structure of the mold or die.

The projecting end of the detecting electrode and the lead wire can be readily covered and concealed by the operation of joining the insulating members without requiring another operation for insulating the electrode and the lead wire.

The projecting bare end of the detecting electrode and the lead wire can be readily coated with the rubber cement in the operation of joining the insulating members together. In this case, the rubber cement can further improve the bonding strength and the water tightness. In the case of the rubber cement, it is possible to assign high priority to the adhesive strength, and choose an adhesive of a type capable of providing a strong adhesive bonding with metal or resin. Therefore, the rubber cement makes it possible to bond the insulating members very firmly and tightly.

The detecting electrode may be U-shaped or semicylindrical. The U-shaped or semicylindrical detecting electrode partly surrounds the high tension cord, and extends along the high tension cord. The detecting electrode of this configuration provides a capacitance (or coupling capacitance) comparable to a capacitance obtained by a cylindrical electrode, and accordingly enables an accurate detection of a secondary voltage waveform.

The insulating tube may be formed by joining two insulating members having approximately semicylindrical shapes. These two insulating members can be set on both sides of the high tension cord and joined together to form the insulating tube mounted on the high tension cord. Therefore, these insulating members facilitates the production process and arrangement of the secondary voltage detector.

The electric shielding means or member may be in the form of a shielding case formed by joining two approximately semicylindrical metallic shielding members together. This shielding case is advantageous in shielding effectiveness, ease in assemblage, and durability.

DETAILED DESCRIPTION OF THE INVENTION

Figure 1:
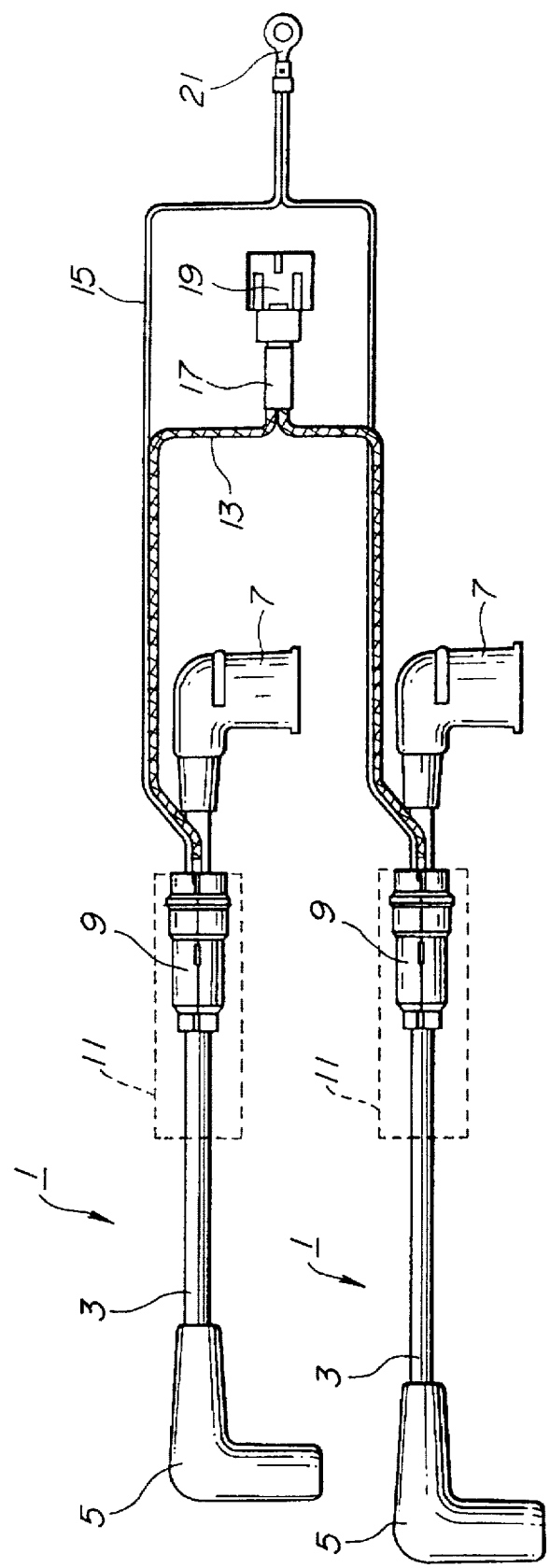
FIG. 1 is a view showing secondary voltage detectors according to a first embodiment of the present invention, each mounted on a high tension cord.
Figure 2:
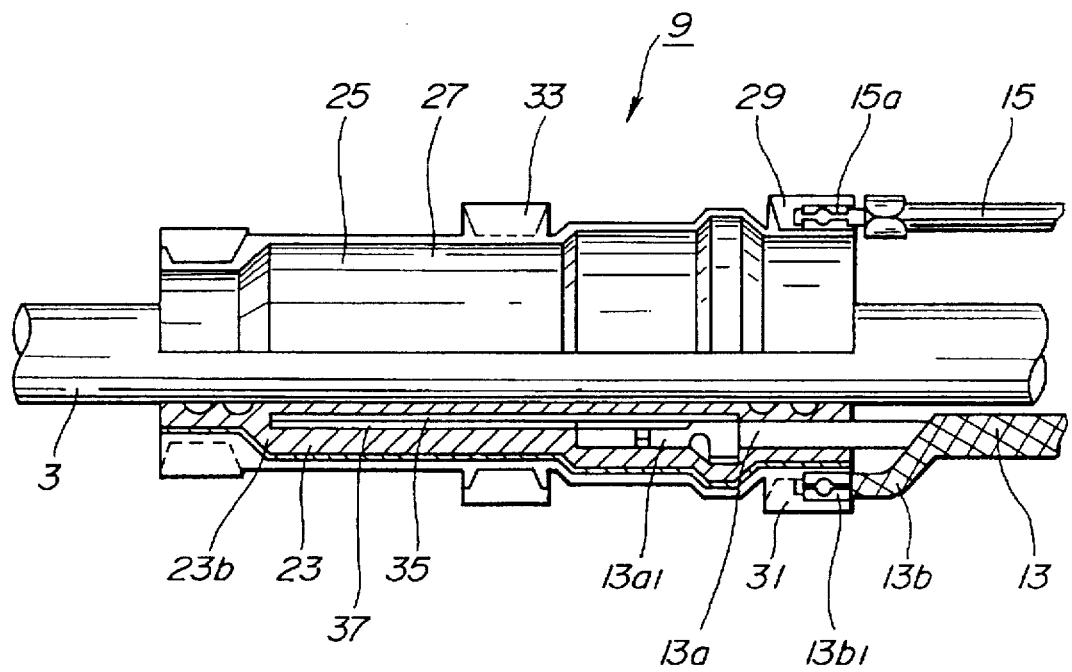
FIG. 2 is a partially cutaway plan view of one of the secondary voltage detectors shown in FIG. 1.
Figure 3:
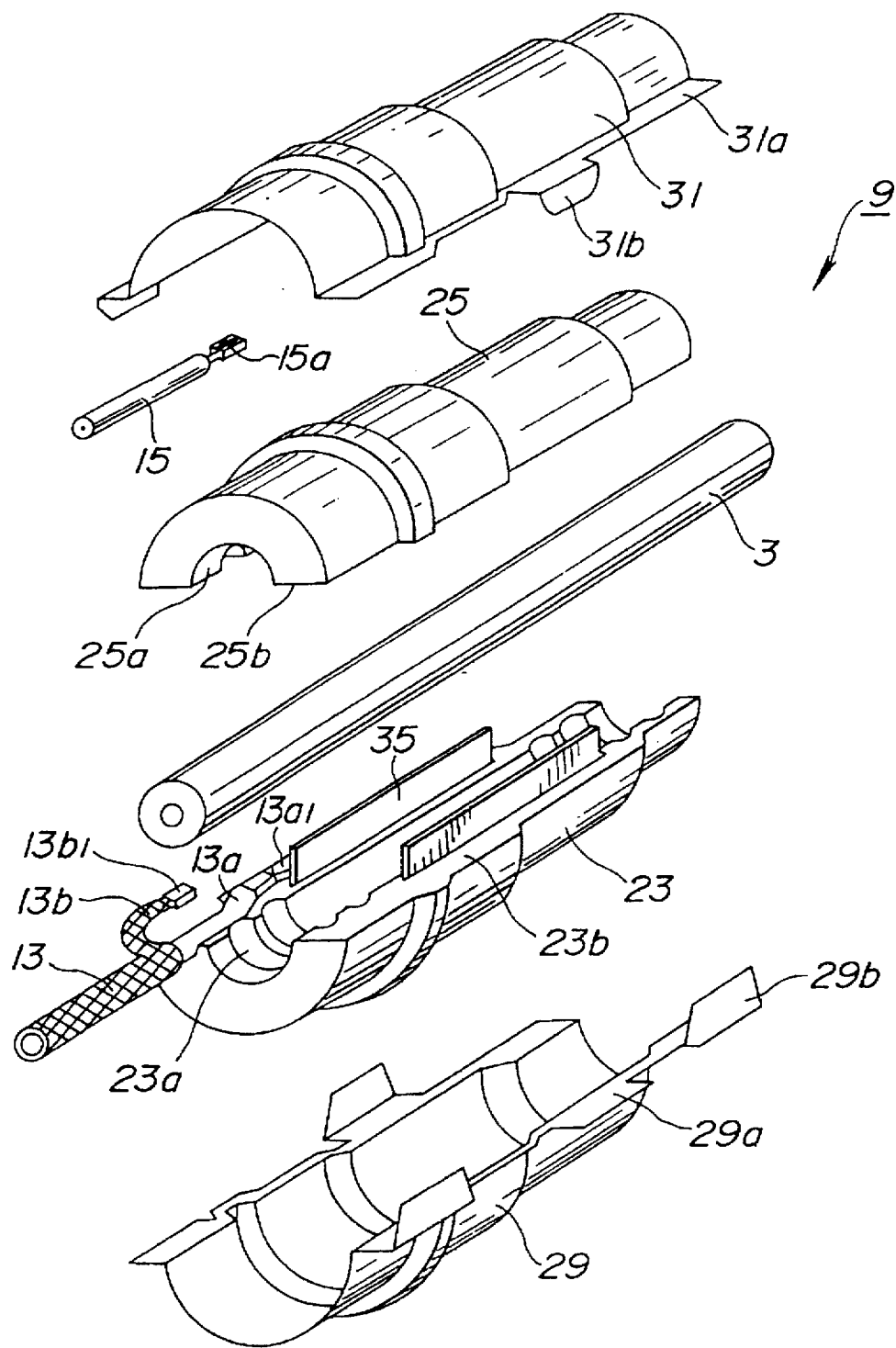
FIG. 3 is an exploded perspective view of the secondary voltage detector of FIG. 2.

FIGS. 1, 2 and 3 show a first embodiment of the present invention.

As shown in FIG. 1, each of high tension cord units 1 to be used for a gasoline engine has a cord 3, a plug cap 5 equipped at one end of the cord 3, and a coil cap 7 equipped at the other end of the cord 3.

A secondary voltage detector 9 according to this embodiment of the present invention is mounted on each of the high tension cords 3. Each of the secondary voltage detector 9 has a circular center hole through which the corresponding cord 3 passes through. Each secondary voltage detector 9 extends longitudinally from a first end to a second end, and the center hole extends longitudinally from the first end to the second end.

As shown in FIGS. 2 and 3, each of the secondary voltage detectors 9 of this example includes at least an insulating tube 27 through which the cord 3 passes through, and a metal shield case 33 enclosing the insulating tube 27.

The insulating tube 27 of this example comprises first and second insulating component parts (or first and second insulating members) 23 and 25 made of rubber. The metal shield case 33 of this example is made up of first and second metal shield component parts (or members) 29 and 31.

A detecting electrode 35 is embedded in the first part 23 of the insulating tube 27, and connected with a shield cable 13 having coaxially arranged lead wires 13a and 13b. A grounding cable 15 is connected with the shield case 33.

As show in FIG. 1, each detector 9 is housed in a protective tube 11 which, in this example, is a foam (or formed) tube made of ethylene propylene rubber (EPDM). The shield cable 13 from each detector 9 is connected through an identification tube 17 to a contact unit 19 for connection to a secondary voltage waveform detection circuit as mentioned later. The grounding cables 15 of the detectors 9 are connected to a ground terminal 21.

The first and second insulating parts 23 and 25 of the insulating tube 27 have substantially identical shapes obtained by splitting a hollow cylinder lengthwise into two equal parts by an imaginary plane containing the axis of the cylinder. Each of the first and second parts 23 and 25 has a center groove 23a or 25a having a semicircular cross section. When the first and second approximately semicylindrical parts 23 and 25 are assembled into the tube 27, the semicircular grooves 23a and 25a of the first and second parts 23 and 25 form the above-mentioned circular center hole of the tube 27 receiving the corresponding cord 3. Each of the semicylindrical parts 23 and 25 has flat joint surfaces 23b or 25b which, in this example, exist in the plane containing the axis of the semicylindrical shape. In the assembled state, the flat joint surfaces 23b and 25b of the first and second parts 23 and 25 are put in contact with one another and joined together to form the insulating tube 27. The semicylindrical parts 23 and 25 are stepped so that the outside diameter of the tube 27 varies stepwise.

The detecting electrode 35 is embedded in the first insulating part 23. The detecting electrode 35 is a U-shaped metal plate. The electrode 35 has an approximately semicylindrical portion embedded in the semicylindrical first part 23 coaxially, and left and right portions projecting, respectively, from the left and right flat joint surfaces 23b. On the other hand, the second insulating part 25 has no embedded electrode. Instead, the second part 25 is formed with narrow hollow portions 37 for receiving and concealing the left and right projecting portions of the detecting electrode 35 and the (inner) lead wire 13a.

The first and second shield parts 29 and 31 are approximately semicylindrical, too. The first and second shield parts 29 and 31 have configurations to fit over the first and second insulating parts 23 and 25. Each shield part 29 or 31 has flat plate-like flanges 29a or 31a which project radially, respectively, from the left and right brims of the shield part 29 or 31. The flanges 29a or 31a of this example extend in a plane containing the axis of the shield case 33. Each shield part 29 or 31 has a plurality of upright tabs (flaps) 29b or 31b each projecting from the projecting end of one of the flanges 29a and 31a toward the other shield part 31 or 29. The shield case 33 is formed by fitting the shield parts 29 and 31 over the insulating parts 23 and 29 with the flanges 29a and 31a overlapping each other, and bending each tab 29b or 31b so that each flange of one of the shield parts 29 and 31 is pressed between one tab and one flange of the other shield part 31 or 29. By such a hemming operation, the shield parts 29 and 31 are joined together to form the shield case 33.

Of the lead wires 13a and 13b of the before-mentioned shield cable 13, the lead wire 13a is an inner conductor surrounded by and insulated from the other conductor 13b. An end of the inner lead wire 13a is equipped with a terminal 13a1 which is joined by spot welding to one of the projection portions of the detecting electrode 35 embedded in the first insulating part 23. The outer lead wire 13b has an end having a terminal 13b1 spot-welded to one of the flanges 31a of the second shield part 31. The grounding cable 15 also has a terminal 15a at one end, and this terminal 15a is spot-welded to one of the tabs 29b of the first shield part 29.

Figure 4:
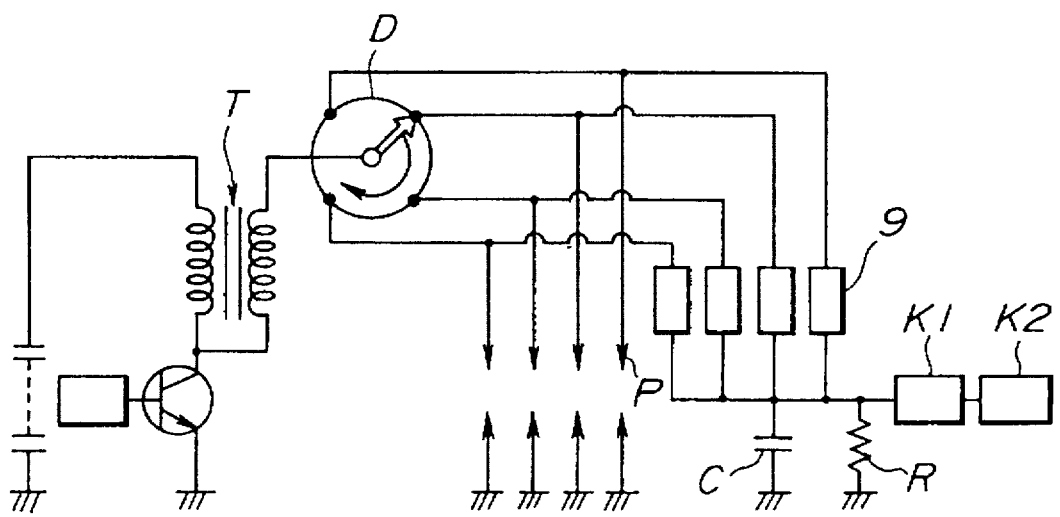
FIG. 4 is a circuit diagram of a circuit including an ignition circuit for a gasoline engine and a secondary voltage detecting circuit having the secondary voltage detectors shown in FIG. 1.

Each of the thus-constructed secondary voltage detectors 9 is used as a sensing device of a secondary voltage detecting circuit for an ignition circuit of a known type, as shown in FIG. 4. The ignition circuit shown in FIG. 4 comprises at least a distributor D, an ignition coil T, and spark plugs P. The secondary voltage detecting circuit comprises at least the secondary voltage detectors 9, a capacitor (or condenser) C connected between the ground and the detectors 9, a resistor R connected in parallel to the capacitor C, a secondary voltage waveform detecting circuit K1, and a judging circuit K2 including a microcomputer as a main component. This secondary voltage detecting circuit can monitor the secondary voltage waveform in the ignition system and judge whether an engine condition such as misfire does exist or not.

FIGS. 5 and 6 illustrate a production process for producing the secondary voltage detector according to this embodiment of the invention.

Figure 5A:
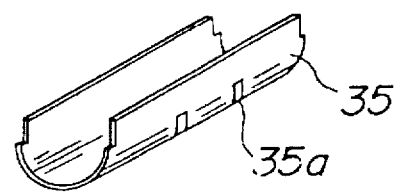
FIGS. 5A–5D and FIGS. 6A–6D are perspective views showing a sequence of steps in a production process for producing the secondary voltage detector shown in FIG. 2.

First, the detecting electrode 35 is formed by bending a metal plate (or sheet) of stainless alloy (or stainless steel) into a U shape, as shown in FIG. 5A. Instead of the stainless alloy plate, it is possible to employ a plate (or sheet) of some other material such as copper or aluminum. In this example, the detecting electrode 35 is formed with uneven portions 35a, such as outward projections, extending along a curved direction in order to increase the shape retaining capability and the rigidity and improve the moldability and the capability of being firmly embedded in a molding.

Figure 5B:
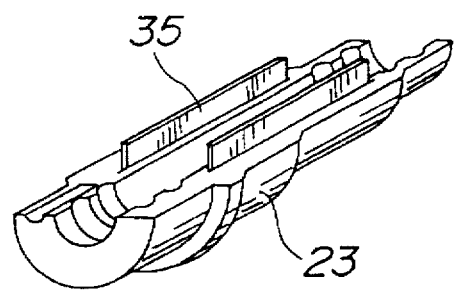

Second, a mold or die (not shown) and the detecting electrode 35 whose one end is fixed with the mold are set in a machine for molding, and a rubber molding operation is performed by using rubber material such as ethylene propylene rubber. One molding cycle yields the first insulating part 23 having the detecting electrode 35 embedded therein except both ends, as shown in FIG. 5B.

Figure 5C:
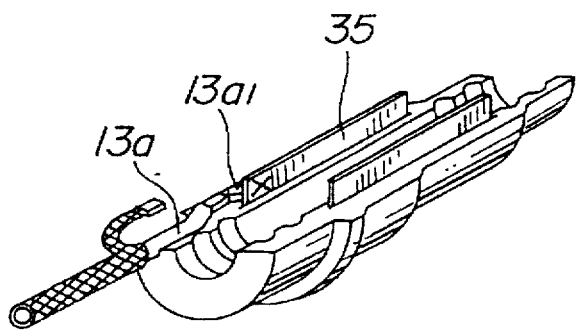

Then, the terminal 13a1 of the inner lead wire 13a is spot welded to the outer side of one of the projecting bare portions of the detecting electrode 35 as shown by a cross mark in FIG. 5C.

Figure 5D:
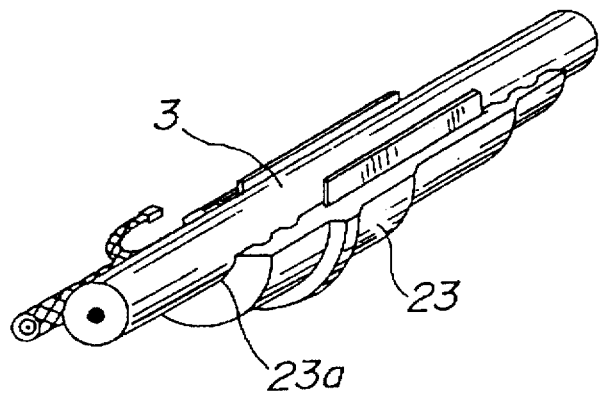

In a next step shown in FIG. 5D, rubber cement is applied to the semicircular center groove 23a of the first insulating part 23, and the cord 3 is fit in the center groove 23a of the first insulating part 23.

Figure 6A:
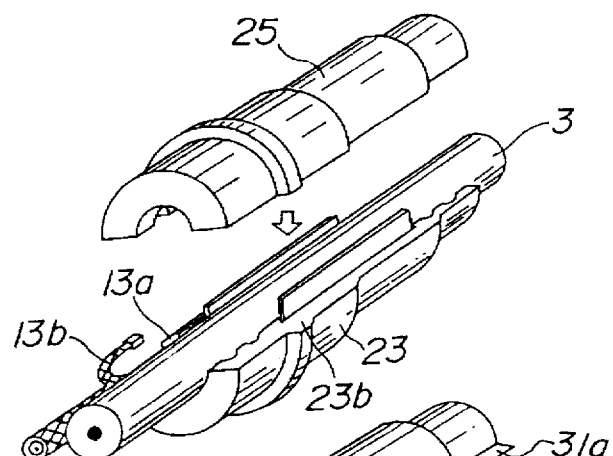

Then, rubber cement is further applied to the upper surface of the cord 3, the joint surfaces 23b of the first insulating part 23, and a joint portion of the lead wire 13a, and the second insulating part 25 is fit over the cord 3, as shown in FIG. 6A. In this way, the first and second insulating parts 23 and 25 of the approximately identical configurations are bonded together to form the insulating tube 27 fixedly mounted on the cord 3.

Figure 6B:
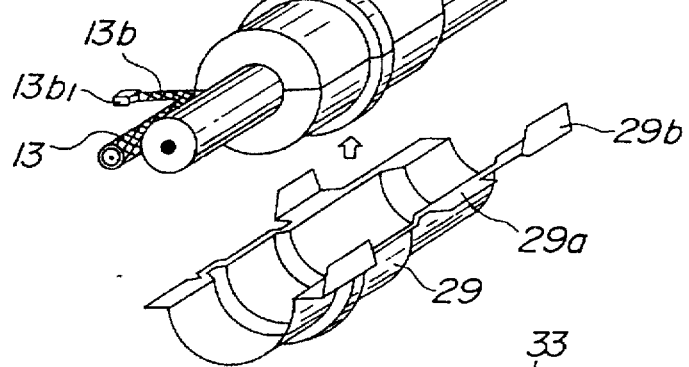

In a step shown in FIG. 6B, the first and second shield parts 29 and 31 are fit over the insulating tube 27 from both sides, and both parts 29 and 31 are joined to form the shield case 33 by folding each projecting tab 29b or 31b of each shield part 29 or 31 back on the adjacent flange 31a or 29a of the other shield part 31 or 29.

Figure 6C:
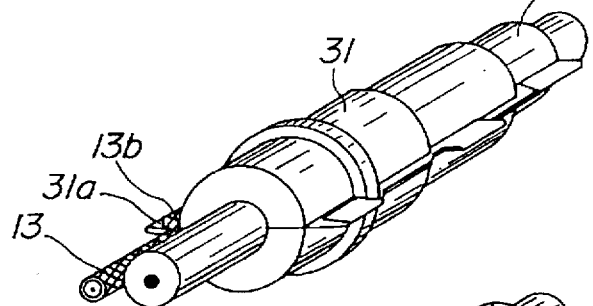
Figure 6D:
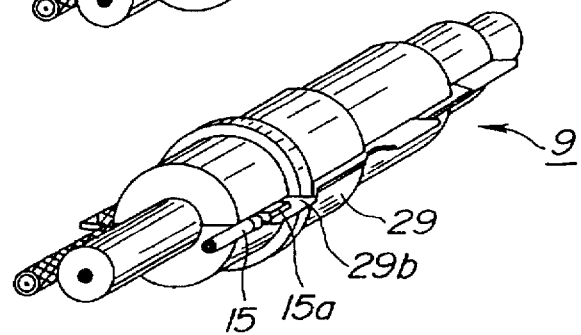

Then, the terminal 13b1 of the outer lead wire 13b is spot welded to the upper surface of the left side flange 31a of the second shield part 31 as shown in FIG. 6C.

Finally, the terminal 15a of the grounding wire 15 is spot welded to the upper surface of one of the folded tabs 29b on the right side of the first shield part 29. The secondary voltage detector 9 according to this embodiment is completed in this way.

In this production process, both ends of the detecting electrode 35 are left exposed at the stage of rubber molding for forming the first insulating part 23. Thereafter, the lead wire 15a is connected to the exposed end of the electrode 35 on one side, and the first and second insulating parts 23 and 25 are bonded around cord 3 with the rubber cement so that the electrode 35 are entirely buried in the tube 27 of the first and second parts 23 and 25. Accordingly, this production process requires only one step of the molding operation, and simplifies the configuration of the mold.

The insulating tube 27 is readily mounted on the high tension cord 3 by joining the two semicylindrical parts 23 and 25 around the cord 3. Therefore, the process of producing the secondary voltage detector can be separated from the process of producing the high tension cord assembly 1. The process according to the present invention does not require insertion of a new line for production of the secondary voltage detector 9 into the line for production of the high tension cord assembly 1. The line for the secondary voltage detector 9 can be independent from the production of the high tension cord assembly 1. Therefore, this process can reduce an initial investment in plant and equipment, and improve the flexibility, efficiency and workability of the production.

In the operation for bonding the first and second insulating parts 23 and 25, the bare ends of the detecting electrode 35 and the lead wire 13a are coated with rubber cement that hardens or cures at ordinary room temperatures. With application of this rubber cement, the joint tube structure is sufficiently air tight and water proof.

The insulating tube 27 is not in the form of a plain cylinder, but there is integrally formed, in the outside surface, an annular projection like an outward flange. Therefore, the shield parts 29 and 31 can be assembled fittingly and securely on the tube 27 simply by folding the tabs 29b and 31b like a metal edge finished by hemming.

The foam tube 11 prevents the secondary voltage detector 9 from impairing an adjacent device during vibrations, and protects the detector 9 against heat and impact from the outside.

The present invention is not limited to the illustrated embodiment but various modifications and variations are possible. For instance, corrugation in the contact portion of the second insulating part 25 contacting with the lead wire is effective to ensure the sealing between the lead wire and the insulating member besides application of rubber cement.

The air-tightness can be further improved by an arrangement of an O ring fit on the lead wire and a groove formed in the second insulating part 25 for receiving the O ring.

Figure 7:
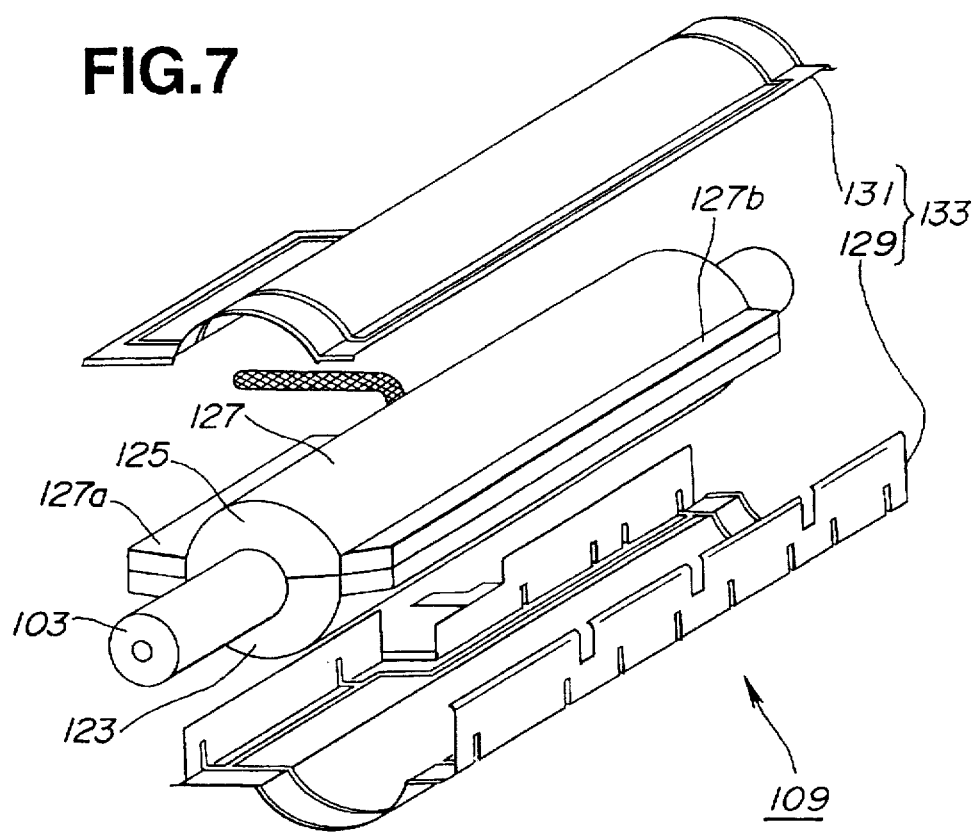
FIG. 7 is an exploded perspective view of a secondary voltage detector according to a second embodiment of the present invention.
Figure 8:
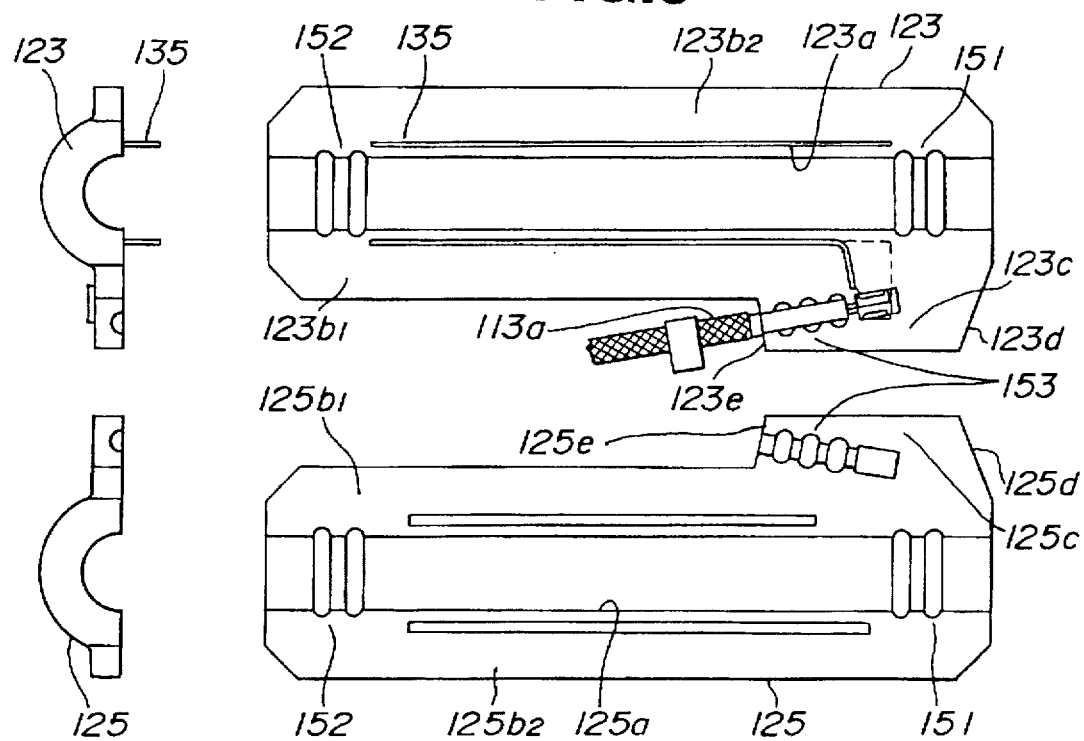
FIG. 8 is a view showing first and second insulating members of FIG. 7 in side elevation and plan view.

FIGS. 7 and 8 show a second embodiment of the present invention. A secondary voltage detector 109 according to the second embodiment is different in shapes of insulating and shield members from the detector 9 according to the first embodiment.

The secondary voltage detector 109 shown in FIG. 7 includes at least an insulating tube 127 mounted on a high tension cord 103, and a metal shield case 133, like the detector 9 shown in FIG. 3. The insulating tube 127 comprises a first insulating half member 123 in which a detecting electrode 135 is embedded, and a second insulating half member 125. The shield case 133 comprises first and second half metal shield members 129 and 131, as in the first embodiment.

Unlike the detector 9 of FIG. 3, the insulating tube 127 of FIG. 7 has first and second joint flanges 127a and 127b projecting radially outward from a stepless main cylindrical portion of the insulating tube 127. The main cylindrical portion in the example of FIG. 7 is in the form of a right circular cylinder having a center hole receiving the high tension cord 103. The first and second joint flanges 127a and 127b extend along the axial direction of the high tension cord 103 on both sides of the high tension cord 103. The first joint flange 127a is formed by joining first flanges of the first and second half members 123 and 125, and the second joint flange 127b is formed by joining second flanges of said first and second half members 123 and 125.

As shown in FIG. 8, the first insulating half member 123 has a first flat joint surface 123b1 extending radially from a semicircular center groove 123a of the first half member 123, to the projecting radial end of the first flange of the first half member 123, and a second flat joint surface 123b2 extending radially from the center groove 123a to the radial end of the second flange of the first half member 123. Similarly, the second insulating half member 125 has a first flat joint surface 125b1 extending radially from a center groove 125a of the second half member 125, to the projecting radial end of the first flange of the second half member 125, and a second flat joint surface 125b2 extending radially from the center groove 125a to the radial end of the second flange of the second half member 125.

With the flanges 127a and 127b of the insulating tube 127, it is possible to increase the widths and hence the areas of the first and second joint surfaces 123b1, 123b2, 125b1 and 125b2 of the first and second half members 123 and 125. The flanged configuration of the insulating tube 127 shown in FIGS. 7 and 8 having the wide joint surfaces can improve the water tightness between the first and second half members 123 and 125, so that water cannot enter radially therebetween to the detecting electrode 135 and the center grooves 123a and 125a.

In the example shown in FIGS. 7 and 8, each of the first flanges of the first and second half members 123 and 125 has an extended flange portion 123c or 125c, and the first joint flange 127a of the insulating tube 127 has an extended joint flange portion formed by joining the extended flange portions 123c and 125c. The extended flange portion of the first joint flange 127a projects radially outward beyond the radial flange end of the first joint flange 127a. Each of the first joint surfaces 123b1 and 125b1 of the first and second half members 123 and 125 has an extended joint area extending over the extended flange portion 123c or 125c of the first or second half members 123 or 125. In other words, each of the first flanges of the first and second half members 123 and 125 has a narrow flange section having a narrow width measured along the radial direction, and a wide flange section which has the extended flange portion, so that the width of the wide flange section is greater than the width of the narrow flange section.

First and second semicircular recesses are formed, respectively, in the extended joint areas (123c and 125c) of the first joint surfaces 123b1 and 125b1 of the first and second half members 123 and 125. These recesses form a wire receiving hole receiving a lead wire 113a connected to the detecting electrode 135.

The extended flange portions 123c and 125c can facilitate the operation for inserting the lead wire 113a between the first and second half members 123 an 125, and improve the water tightness around the lead wire 113a.

In this example, the center hole of the insulating tube 127 comprises first and second corrugated sections 151 and 152. The detecting electrode 135 is situated axially between the corrugated sections 151 and 152. Similarly, the wire receiving hole receiving the lead wire 113a comprises a corrugated section 153. In each of these corrugated sections 151, 152 and 153, a half of the corrugated section is formed in the first half member 123 and the other half is formed in the second half member 125. The corrugated sections 151 and 152 of the center hole can prevent water from axially entering the middle section of the center hole along the detecting electrode 135. Similarly, the corrugated section 153 can improve the water tightness around the lead wire 113a. Each corrugated section may comprise one or more annular projections similar to annular inward flanges.

The extended flange portion of the first joint flange 127a of the insulating tube 127 is located near the first tube end of the insulating tube 127 which is the right side end as viewed in FIG. 8. The extended flange portion 123c or 125c of the first flange of each half member 123 or 125 extends axially from a first axial end 123d or 125d near the first tube end on the right side in FIG. 8, to a second axial end 123e or 125e which is remoter from the (right side) first tube end of the insulating tube 127 than the first axial end 123d or 125d. In this example, the second axial end 123e or 125e of the extended flange portion 123c or 125c in each half member 123 or 125 is located axially between the (right side) first tube end and the middle of the insulating tube 127. Accordingly, the distance between the (left side) second axial end 123e or 125e and the (left side) second tube end is greater than the distance between the (right side) first axial end 123d or 125d and the (right side) first tube end. The wire receiving hole receiving the lead wire 113a has a hole end which is formed in the second axial ends 123e and 125e of the extended flange portions 123c and 125c of the first and second half members 123 and 125, and the first wire 113a projects from the hole end of the wire receiving hole toward the (left side) second tube end of the insulating tube 127.

In this arrangement, the shield cable extends along the shield case 133, so that the second wire (of a ground potential) cannot touch the high tension cord 103. By separating the second wire from the high tension cord, this arrangement can prevent deterioration of the high tension cord by preventing a corona discharge from being caused by the conductor of the ground potential near the high tension cord 103.

What is claimed is:

1. A secondary voltage detector, mounted on a high tension cord, for forming a capacitance with the high tension cord and thereby detecting a waveform of a secondary voltage supplied through the high tension cord to a spark plug of a gasoline engine, said secondary voltage detector comprising:

an insulating tube which is mounted on the high tension cord, and which comprises a plurality of insulating members joined together;

a detecting electrode embedded in at least one of said insulating members; and an electric shielding means enclosing said insulating tube, wherein said detecting electrode includes an embedded portion embedded in a first insulating member which is one of said insulating members, and a bare end projecting from a joint surface of said first insulating member, and wherein said first insulating member is joined to a second insulating member which is another of said insulating members, said second insulating member including a joint surface, and a groove formed in said joint surface of said second insulating member, said joint surfaces of said first and second insulating members being overlapped and joined together to form said insulating tube, and said bare end of said detecting electrode being received in said groove of said second insulating member when said first and second insulating members are joined together.

2. A secondary voltage detector as claimed in claim 1 wherein said insulating members are made of elastic material.

3. A secondary voltage detector as claimed in claim 2 wherein said insulating members are made of rubber.

4. A secondary voltage detector as claimed in claim 3 wherein said insulating members are joined together into said insulating tube by rubber cement.

5. A secondary voltage detector as claimed in claim 1, wherein said first and second insulating members are joined together by an adhesive into said insulating tube, and said bare end of said detecting electrode is coated with said adhesive, and fixed in said groove of said second insulating member by said adhesive.

6. A secondary voltage detector mounted on a high tension cord, for forming a capacitance with the high tension cord and thereby detecting a waveform of a secondary voltage supplied through the high tension cord to a spark plug of a gasoline engine, said secondary voltage detector comprising:

an insulating tube which is mounted on the high tension cord, and which comprises a plurality of insulating members joined together;

a detecting electrode embedded in at least one of said insulating members; and an electric shielding means enclosing said insulating tube, wherein said detecting electrode comprises an embedded portion embedded in a first insulating member which is one of said insulating members, and a bare end projecting from a joint surface of said first insulating member, and wherein a lead wire is connected to said bare end of said detecting electrode, said first insulating member is joined to a second insulating member which is another of said insulating members of said insulating tube, and said lead wire and said bare end of said detecting electrode are covered by said second insulating member.

7. A secondary voltage detector as claimed in claim 6 wherein said lead wire and said bare end of said detecting electrode are coated with rubber cement, and said first and second insulating members are joined together by the rubber cement.

8. A secondary voltage detector as claimed in claim 1 wherein said detecting electrode is a U-shaped plate which has a U-shaped cross section and which is curved around the high tension cord and extended along an axial direction of the high tension cord.

9. A secondary voltage detector as claimed in claim 1 wherein said first and second insulating members are semicylindrical and approximately in the form of semicylinders obtained by splitting a hollow right circular cylinder axially into two halves.

10. A secondary voltage detector as claimed in claim 9 wherein said electric shielding means includes a shield case comprising first and second metal shield members which are approximately in the form of semicylinders obtained by splitting a hollow right circular cylinder axially into two halves.

11. A secondary voltage detector as claimed in claim 1 wherein said insulating tube has a cross sectional shape substantially in the form of an annulus surrounding the high tension cord, and each of said insulating members has a cross sectional shape substantially in the form of a portion of the annulus bounded by two radii, and wherein said insulating members are bonded together into said insulating tube by an adhesive.

12. A secondary voltage detector as claimed in claim 1 wherein said insulating tube comprises a circular center hole receiving the high tension cord, and is formed by joining said insulating members; said first insulating member is a first half member having a semicircular cross section; said second insulating member is a second half member having a semicircular cross section; each of said first and second half members comprises first and second joint surfaces extending along the high tension cord on both sides of the high tension cord; said first joint surfaces of said first and second members are overlapped and joined together; said second joint surfaces of said first and second members are overlapped and joined together; said detecting electrode comprises a semicylindrical middle portion embedded in said first half member and first and second end portions projecting, respectively, from said first and second joint surfaces of said first half member; and said second member is formed with first and second grooves which are formed, respectively, in said first and second joint surfaces of said second half member and which receive said first and second end portions of said detecting electrode, respectively.

13. A secondary voltage detector as claimed in claim 12 wherein said secondary voltage detector further comprises a wiring means comprising a first wire fixed to an outside surface of said first end portion of said detecting electrode, and said second half member further comprises a recess which is formed in said first joint surface of said second half member and which receives said first wire.

14. A secondary voltage detector as claimed in claim 13:

wherein said shielding means comprises a metal shield case formed by joining first and second shield members;

wherein said wiring means comprises a second wire comprising an end connected to said shield case, and a grounding wire connected with said shield case;

wherein said wiring means comprises a coaxial cable comprising said first and second wires, and said first wire is surrounded by said second wire;

wherein each of said first and second half members comprises a semicircular center groove extending between said first and second joint surfaces and receiving the high tension cord;

wherein each of said insulating tube and said shield case comprises first and second small diameter sections and a large diameter section which is formed between said first and second small diameter sections, and an outside diameter of said large diameter section is greater than an outside diameter of said first small diameter section and greater than an outside diameter of said second small diameter section;

wherein said first joint surface of said first half member is formed with a recess forming a wire receiving hole with said recess of said second half member, said wire receiving hole extends along the high tension cord and receives said first wire;

wherein said shield case comprises first and second joint flanges extending along the high tension cord on both sides of the high tension cord and projecting radially outward in opposite directions; each of said first and second joint flanges comprises a tab-less flange segment formed in one of said first and second shield members and a tabbed flange segment which is formed in the other of said first and second shield members and which is formed with a tab; and said tab-less and tabbed flange segments of each of said first and second joint flanges are overlapped and joined together by bending the tab of said tabbed flange segment onto said tab-less flange segment; and wherein said secondary voltage detector further comprises a foam rubber tube enclosing said shield case.

15. A secondary voltage detector as claimed in claim 12 wherein each of said first and second half members comprises first and second flanges which extend along the high tension cord on both sides of the high tension cord and which project radially outward in opposite directions; and said first and second joint surfaces extend on said first and second flanges, respectively, in each of said first and second half members.

16. A secondary voltage detector as claimed in claim 15 wherein said insulating tube comprises a first joint flange formed by joining said first flanges of said first and second half members, a second joint flange formed by joining said second flanges of said first and second half members, and a cylindrical portion from which said first and second joint flanges project radially outward in opposite directions, respectively, to first and second radial flange ends; and wherein said first joint surfaces of said first and second half members are flat and extend from the center hole of said insulating tube to said first radial flange end of said first joint flange, and said second joint surfaces of said first and second half members are flat and extend from the center hole to said second radial flange end of said second joint flange.

17. A secondary voltage detector as claimed in claim 16 wherein said first joint flange of said insulating tube comprises an extended flange portion projecting radially outward beyond said first radial flange end of said first joint flange; each of said first joint surfaces of said first and second half members comprises an extended joint area extending over said extended flange portion of said first joint flange; and said extended flange portion of said first joint flange is formed with a wire receiving hole which is defined by first and second recesses formed, respectively, in said extended joint areas of said first joint surfaces of said first and second half members and which receives a lead wire fixed to an outside surface of said first end portion of said detecting electrode.

18. A secondary voltage detector as claimed in claim 17 wherein said insulating tube extends axially from a first tube end to a second tube end; said extended flange portion of said first joint flange is located near said first tube end and extends axially from a first axial end near said first tube end, to a second axial end which is located axially between said first axial end of said extended flange portion and said second tube end of said insulating tube; said wire receiving hole comprises a hole end formed in said second axial end of said extended flange portion of said first joint flange; and said first wire projects from said hole end of said wire receiving hole toward said second tube end.

19. A secondary voltage detector as claimed in claim 14 wherein said center hole of said insulating tube is formed with first and second corrugated hole sections between which said detecting electrode is located along an axial direction of said insulting tube; and each of said first and second corrugated hole sections of said center hole comprises a corrugated groove section formed in said center groove of said first half member and a corrugated groove section formed in said center groove of said second half member.

20. A secondary voltage detector as claimed in claim 14 wherein said wire receiving hole comprises a corrugated hole section comprising a corrugated groove section formed in said recess of said first half member and a corrugated groove section formed in said recess of said second half member.

21. A production process for producing a secondary voltage detector, mounted on a high tension cord, for forming a capacitance with the high tension cord, and thereby detecting a waveform of a secondary voltage supplied through the high tension cord to a spark plug of a gasoline engine, said production process comprising:

a first step of forming a first insulating member in which a detecting electrode is embedded, leaving a first electrode portion of said detecting electrode exposed;

a second step of connecting a lead wire to said first electrode portion of said detecting electrode after said first step;

a third step of forming an insulating tube mounted on the high tension cord, after said second step, by joining said first insulating member on one side of the high tension cord and a second insulating member on the other side of the high tension cord together by an adhesive so as to cover said lead wire and said first electrode portion of said detecting electrode; and a fourth step of enclosing said insulating tube with an electric shielding layer after said third step.

22. A production process as claimed in claim 21;

wherein said first insulating member formed by said first step comprises first and second joint surfaces and a center groove extending between said first and second joint surfaces;

wherein said detecting electrode embedded in said first insulating member in said first step comprises a middle electrode portion embedded in said first insulating member, said first electrode portion which projects from said first joint surface of said first insulating member and a second electrode portion projecting from said second joint surface of said first insulating member; and wherein said third step comprises a first sub-step of joining said first insulating member to the high tension cord fit in said center groove of said first insulating member with the adhesive interposed between said center groove and the high tension cord, and a second sub-step of overlaying said second insulating member on said first and second joint surface of said first insulating member and the high tension cord, and joining said second insulating member to said first insulating member and the high tension cord by the adhesive applied on said first and second joint surface of said first insulating member, said lead wire, and said high tension cord fit in said center groove of said first insulating member.

23. A production process as claimed in claim 22 wherein said first step comprises a rubber molding operation for making said first insulating member of rubber, said second step comprises a spot welding operation for welding a terminal of said lead wire to an outside surface of said first electrode portion of said detecting electrode, and said fourth step comprises an operation for forming a metal shield case serving as said electric shielding layer and enclosing said insulating tube by joining first and second shield members together.

24. A secondary voltage detector as claimed in claim 1, wherein said insulating tube comprises a center hole extending from a first open end to a second open end and receiving the high tension cord passing through the center hold; and wherein said joint surfaces of said first and second insulating members extend along said center hole from said first open end to said second open end, and extend from an outside surface of said insulating tube to said center hole.

25. A secondary voltage detector as claimed in claim 1, wherein said second insulating member is entirely made of an insulating material and said second insulating member does not have a conductive portion.

26. A secondary voltage detector as claimed in claim 6, wherein said lead wire is placed between said first and second insulating members.

27. A production process as claimed in claim 21, wherein said first insulating member formed by said first step comprises a joint surface from which said first electrode portion of said detecting electrode projects outwards;

wherein said second insulating member used in said third step comprises a joint surface and a groove formed in said joint surface of said second insulating member;

wherein said second step comprises an operation of joining one end of said lead wire to said first electrode portion projecting from said joint surface of said first insulating member;

wherein said insulating tube formed by said third step comprises said joint surfaces of said first and second insulating members which are overlapped face to face and joined by said adhesive; and wherein said first electrode portion of said detecting electrode which is received in said groove of said second insulating member and covered by said second insulating member.

28. A production process as claimed in claim 27, wherein said insulating tube formed by said third step comprises a center hole extending from a first open end to a second open end and receiving the high tension cord passing through the center hole; and wherein said joint surfaces of said first and second insulating members extend along said center hole from said first open end to said second open end, and extend from an outside surface of said insulating tube to said center hole.

* * * * *